(12) United States Patent
Eitel

(10) Patent No.: US 7,061,956 B2
(45) Date of Patent: Jun. 13, 2006

(54) HIGH SPEED VERTICAL CAVITY SURFACE EMITTING LASER DEVICE (VCSEL) WITH LOW PARASITIC CAPACITANCE

(75) Inventor: Sven Eitel, Zurich (CH)

(73) Assignee: Avalon Photonics AG, Zurich (CH)

( * ) Notice: Subject to any disclaimer, the term of this patent is extended or adjusted under 35 U.S.C. 154(b) by 125 days.

(21) Appl. No.: 10/422,397

(22) Filed: Apr. 24, 2003

(65) Prior Publication Data
US 2003/0231682 A1 Dec. 18, 2003

(30) Foreign Application Priority Data
Apr. 25, 2002 (EP) .................... 02009477

(51) Int. Cl.
*H01S 5/00* (2006.01)
(52) U.S. Cl. ............... 372/50.1; 372/44.01; 372/87
(58) Field of Classification Search .............. 372/44, 372/47, 50, 87, 44.01, 46.011, 50.1
See application file for complete search history.

(56) References Cited

U.S. PATENT DOCUMENTS

| 5,991,326 | A * | 11/1999 | Yuen et al. .............. 372/96 |
| 6,069,908 | A * | 5/2000 | Yuen et al. .............. 372/96 |
| 6,687,268 | B1 * | 2/2004 | Kitamura et al. ......... 372/22 |
| 6,798,810 | B1 * | 9/2004 | Albrecht .................. 372/45 |
| 6,829,282 | B1 * | 12/2004 | Wipiejewski ............. 372/96 |

FOREIGN PATENT DOCUMENTS

| DE | 101 36 334 A1 | 2/2002 |
| EP | 0 935 322 A1 | 8/1999 |
| WO | WO 01/04951 A1 | 1/2001 |
| WO | WO 01/69736 A2 * | 9/2001 |
| WO | WO 02/13334 A2 * | 2/2002 |

OTHER PUBLICATIONS

Chirosky et al, Implant-Apertured and Index-Guided Vertical-Cavity Surface-Emitting Lasers, May 1999, IEEE Photonics Technology Letters, vol. 11, No. 5, pp. 500-502.
Krishnamoorthy et al, Vertical-Cavity Surface-Emitting Lasers Flip-Chip Bonded to Gigabit-per-Second CMOS Circuits, Jan. 1999, IEEE Photonics Technology Letters, vol. 11, No. 1, pp. 128-130.

(Continued)

*Primary Examiner*—James Menefee
(74) *Attorney, Agent, or Firm*—Fattibene & Fattibene; Paul A. Fattibene; Arthur T. Fattibene

(57) ABSTRACT

A design of a vertical cavity surface emitting laser chip suitable for high speed data communication. An intracavity contact to the doped layers of the bottom mirror is formed so that both contacts are on the top epitaxial side of the wafer. These main structural features can be used to reduce the bond pad capacitance by a suitable spatial separation of metallizations of the p and n contact. The bond pads are processed as a short symmetric coplanar line in a ground signal ground configuration which allows flexible device testing and packaging. A significant capacitance between the pads of the center strip and the outer ground strips is avoided by etching the doped semiconductor layers between these strips down to the semi-insulating substrate. This design avoids pad metallizations and the corresponding critical photolithographic steps over large height differences from the vertical cavity surface emitting laser mesa top to the substrate. This insures good lithographic fidelity and makes the process reproducible.

28 Claims, 9 Drawing Sheets

OTHER PUBLICATIONS

Geib et al, Comparison of Fabrication Approaches for Selectively Oxidizing VCSEL Arrays, 2000, SPIE vol. 3946, pp. 36-40.

Lerr et al, Small and Large Signal Modulation of 850 nm Oxide-Confined Vertical Cavity Surface Emitting Lasers, 1997, OSA Trends in Optics and Photonics, vol. 15, pp. 69-74.

Wiedenmann et al, Design and Analysis of Single-Mode Oxidized VCSEL's for High-Speed Optical Interconnects, 1999, IEEE J. Sel. Top. Quant. Electron., vol. 5, pp. 503-511.

* cited by examiner

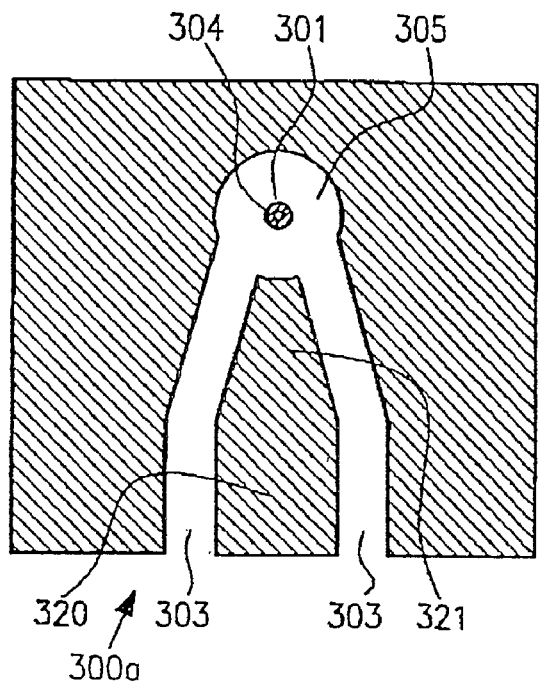
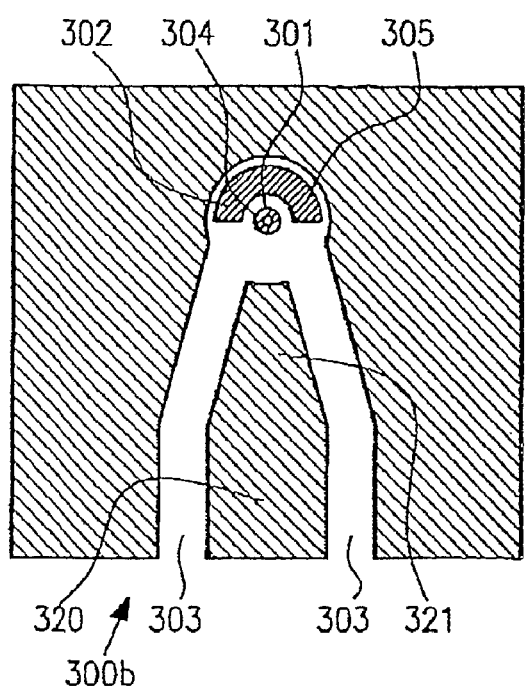
FIG.3a  FIG.3b
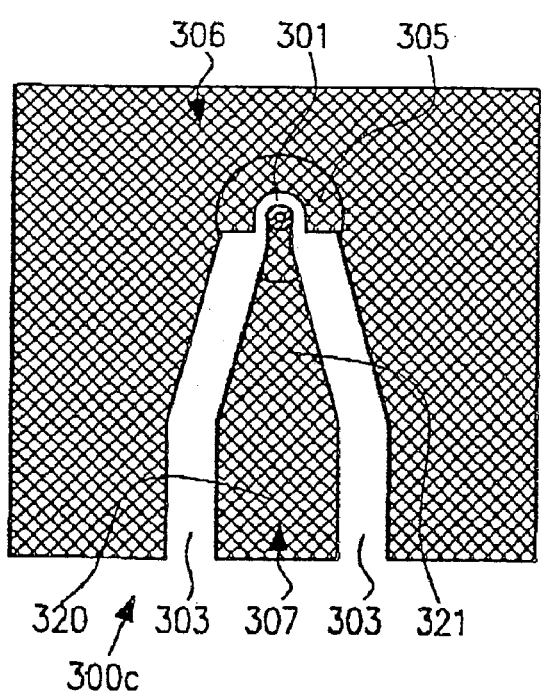
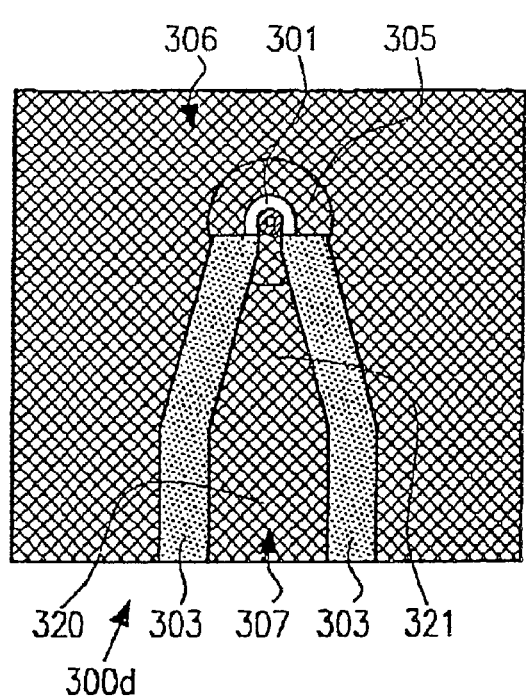
FIG.3c  FIG.3d

HIGH SPEED VERTICAL CAVITY SURFACE EMITTING LASER DEVICE (VCSEL) WITH LOW PARASITIC CAPACITANCE

FIELD OF THE INVENTION

The present invention relates to a vertical cavity surface emitting laser device (VCSEL) comprising a first stack of semiconductor layers representing a first distributed Bragg reflector, a second stack of semiconductor layers representing a second distributed Bragg reflector, a light emitting active region arranged between the first and second distributed Bragg reflectors, a mesa region surrounded at least partly by a first trench, a semi-insulating substrate and a first contact portion contacting the first distributed Bragg reflector and a second contact portion contacting the second distributed Bragg reflector.

BACKGROUND OF THE INVENTION

The vertical cavity surface emitting laser is a semiconductor laser that emits light perpendicular to the substrate, in contrast to the conventional edge emitting laser. VCSELs have several advantages compared to conventional edge emitting semiconductor lasers, which makes them very attractive for applications such as spectroscopy, data communication or consumer electronics, like DVD players. Among others, VCSEL devices provide a high power conversion efficiency, low threshold currents (less than 1 mA is possible), better focusing due to a symmetrical circular beam profile, ability to test devices on wafer, ease of fabrication into arrays, high temperature stability and high reliability.

The key design of a VCSEL device comprises two mirrors which are stacked on top of each other parallel to a substrate. The mirrors are stacks of alternating semiconductor layers of different indices of refraction which are designed to form distributed Bragg reflectors. The two mirrors are doped with n-dopants and p-dopants, respectively, such that an interface region where the mirrors contact an active region can form a p-n junction. This p-n junction defines the light emitting active area where electrons and holes can recombine causing the emission of light. The efficiency of this recombination in the active area can be improved by using a heterostructure with sufficiently thin layers in the active layer which can form so-called quantum wells. A basic structure thereof is described, for example, in U.S. Pat. No. 4,949,350.

In a typical configuration, each mirror comprises of a periodic layer stack of up to 40 alternating low and high refractive index $Al_xGa_{1-x}As$ layers, whereby each layer has a thickness corresponding to the optical length of $\lambda/4$, wherein $\lambda$ is the wavelength of the emitted laser light. Thus reflectivities as high as 99.99% can be achieved . One of the mirrors is provided with lower reflectivity thereby defining an output coupler for the emission of laser radiation. Together with a high efficiency of the active region this results in a low threshold current of only a few mA.

A further advantage of the VCSEL is that it enables a single mode design. The selection of a single longitudinal mode can be achieved by a thin cavity in the range of a wavelength of the desired mode. Moreover, a lateral optical confinement to a few microns is important to enable emission in a narrow beam. This may be achieved by lateral structuring of at least one mirror. Substantially this method is called lateral index guiding. A possibility to accomplish lateral index guiding is to shape the upper mirror as circular pillar or taper. This can be fulfilled for example by removing material of a flat distributed Bragg reflector apart from a circular region by employing a wet chemical or dry etch process, which results in a so called mesa structure. The lateral waveguide normally supports multi-transverse mode operation. However, by introducing additional mode filtering structures the losses of the higher order modes can be enhanced relative to the fundamental mode so that the laser device can operate in single mode. A single-mode VCSEL design and a method of its fabrication according to the foregoing is described for instance in EP 1035621.

Triggered by the enormous increase in data rates in local area networks, there has been a strong focus on the development of high speed VCSELs for data transmission applications in recent years. Today, fiber based optical transceivers using oxide confined short wavelength VCSELs with data rates up to 2.5 Gb/s are already commercially available. New local area network communication standards for higher data rates, however, are currently being developed (e.g., 10-Gigabit Ethernet) and will shortly require even faster VCSELs and VCSEL arrays.

A critical factor that limits the maximum modulation speed of VCSELs is the influence of parasitic capacitance caused by electrical parasitic device components which surround the active region of the laser. Most important in this respect is the parasitic capacitance of the bond pads, since it gives rise to a high frequency shunt path around the active laser region. The bond pad capacitance normally dominates, but there are additional minor capacitance contributions due to a possible oxidation layer and the laser diode junction. Moreover, in the case of VCSEL arrays with one common contact of the individual array devices, a high bond pad capacitance leads to a high frequency cross talk resulting in signal distortions.

There are different approaches to optimize the VCSELs for low bond pad capacitance, which have their specific advantages and disadvantages. K. M. Geib et al. summarizes different approaches in "Comparison of Fabrication Approaches for Selectively Oxidized VCSEL Arrays," Proc. SPIE, vol. 3946, pp. 36–40, 2000. There are roughly two categories depending on whether the VCSEL epitaxial layer structure is grown on a doped or a semi-insulating substrate.

In case of a doped substrate, the conductive substrate is typically metallized on the backside to provide the contact for the bottom mirror and only one bond pad is evaporated on the top epitaxial side of the wafer to provide the contact for the top mirror. Due to the wire bonding, the size of the bond pads cannot be arbitrarily reduced and is typically around 100 µm×100 µm. To minimize the capacitance, these devices, therefore, require isolation layers with low dielectric constant and several micron thickness. The etched area around the VCSEL mesa is often completely filled with a polymer (e.g. polyimide, BCB) to get a planarized structure. Such devices are simple to fabricate and several groups have demonstrated prototypes with record high modulation bandwidths.

Unfortunately, polymer planarization is reported to result in voids at the mesa/polymer interface which can lead to breaks in the metal line connecting the mesa to its bond pad. Another significant drawback is the weak metal adhesion to the polymer, which often results in bonding failures due to a delamination of the bond pad.

In the case of a semi-insulating substrate, the known device structure uses an additional contact on the same side of the semi-insulating wafer with regard to the top mirror contact, to allow the injection of charge carriers into the light emitting active region from the bottom mirror side. Etching through the semiconductor layers down to the semi-insulating substrate allows the placement of bond pads for both contacts, the bottom mirror contact and the top mirror contact, close to the level of the semi-insulating substrate. Conductive layers connect the bond pads either with the bottom mirror or the top mirror. A spatial separation of both bond pads removes most of the bond pad capacitance. Thick isolation layers are not needed for a capacitance reduction, but a polymer is often used to bridge the large height difference between the mesa top and the substrate. Hence, this design combines good bond pad adhesion with low capacitance.

Very challenging parts of this approach, however, are the lithographic steps for the metallization over the large height differences (around 10 μm) from the mesa top to the substrate. For typical metal lift off processes, the photoresist has to be structured over both height levels, so that very thick photoresists are required which is at the expense of the lithographic fidelity and process stability. Hence, this device structure has great potential due to the low capacitance, but a reliable fabrication sequence is required to be suitable for production purposes.

In a classical approach, as it is exemplified in U.S. Pat. No. 4,949,350, the stack of semiconductor layers comprising the bottom mirror and the top mirror is placed on a layer of conductive material which may be laminated on the substrate. After removing of layer material around the mesa by etching, the surface of the layer of conductive material is freely exposed and the bottom mirror and the top mirror can be contacted via wire bonding to conductive layers on the substrate and the top of the mesa.

Wire bonding, however, suffers from high parasitic capacitance due to the thin and relatively long bonding wires.

U.S. Pat. No. 5,468,656 describes a VCSEL wherein the mesa is formed by etching a moat. The top mirror is contacted by a conductive layer which extends from the top of the mesa across the moat to a contact pad. To avoid large height differences the moat is etched only partly into the top mirror. To confine the charge carriers to the mesa region and to avoid shunt paths for the charge carriers the material beneath the ground of the moat is treated with implantation techniques to disrupt conductivity from the mesa region to adjacent regions. Apart from the mesa an opening is etched through the top mirror and the light emitting active region down to the bottom mirror. A layer of conductive material on the ground of the opening serves as contact pad for contacting the bottom mirror.

Although this solution provides a moderate separation of contact pads this disclosure leaves the problem of bridging the height difference to the chip surface for an interconnection to the contact pad of the bottom mirror.

Another approach to reduce parasitic capacitance is described in EP 1073171-A2 utilizing lateral injection of charge carriers. A lateral injection VCSEL comprises upper and lower mirrors forming a cavity resonator, an active region disposed in the resonator, high conductivity upper and lower contact layers located on opposite sides of the active region, upper and lower electrodes disposed on the upper and lower contact layers, respectively, and on laterally opposite sides of the upper mirror, and a current guide structure including an apertured high resistivity layer for constraining current to flow in a relatively narrow channel through the active region, characterized in that a portion of the lower contact layer that extends under the top electrode has relatively high resistivity. This feature of EP1073171 serves two purposes. First, it suppresses current flow in parallel paths and, therefore, tends to make the current density distribution in the aperture more favorable for the fundamental mode. Second, it reduces parasitic capacitance.

This structure, however has still the disadvantage that the contact layers are on different levels and a high capacitive bonding technology has to be used for the interconnection of upper and lower contacts.

An approach to improve performance and speed of a VCSEL is described in EP 0663112 wherein a reduction of a serial resistance is achieved by intra cavity structures. The intra cavity structures are formed by a stratified electrode disposed substantially between the light emitting active region and the top mirror. The stratified electrode comprises a plurality of alternating high and low doped layers having a first conductivity type for injecting current into the light emitting active region to cause lasing, thereby establishing a standing wave in the cavity.

WO 01/04951 A1 describes a low capacitance bond pad for high speed VCSEL devices. In the VCSEL described therein, a metal contact area, an associated metal bonding pad and an interconnecting metal bridge are disposed on top of a conductive upper mirror stack. To prevent current flow from the pad through the conductive mirror stack which would bypass the active medium, a moat is etched surrounding the pad area. The moat isolates the pad area and the conductive material beneath the pad area. The metal contact area for the bottom mirror stack is located on a second level. It is, however, difficult to insure reliable fabrication and packaging.

SUMMARY OF THE INVENTION

It is, therefore, an object of the present invention to provide a VCSEL device with reduced electrical parasitics and with an electrical interface suitable for low parasitic packaging (e.g. flip chip bonding) which enables reliable fabrication and packaging procedures. Furthermore, it is essential that the fabrication processes of a VCSEL chip are compatible with a straightforward and reliable VCSEL fabrication sequence which is a prerequisite for cost effective fabrication.

The object is achieved by a vertical cavity surface emitting laser device having the features as initially outlined, which is characterized in that the first contact portion and the second contact portion are arranged at least partially coplanarly above a top epitaxial layer of the vertical cavity surface emitting laser device. This VCSEL design provides reliable fabrication and packaging, thereby reducing parasitic capacitance. The coplanar contact portions enable impedance matched contact design. Moreover, they allow wire as well as flip-chip bonding with low parasitic capacitance.

In one embodiment, the second contact portion comprises a second bondpad and a conductive line connecting the second bondpad to a first layer of conductive material on top of the mesa across a first trench level of the first trench providing a connection to a top mirror. This provides reliable contacting of the top mirror.

In another embodiment the first contact portion comprises a first bondpad connected to a second layer of conductive material on the first trench level of the first trench providing a connection to a bottom mirror. This allows contacting of the bottom mirror from a device level coplanar to the second contact portion. Further the second layer of conductive material allows an intracavity contact and the bottom mirror below this layer may have, but does not require additional doping to provide conductivity.

In a further embodiment, the first contact portion circumscribes the second contact portion. This allows flexible device testing and packaging. Further, a ground-signal-ground configuration can be achieved with this configuration, which provides a better shielding of the signal path against electrical perturbations.

In yet another embodiment, the second contact portion comprises a second bondpad and a conductive line connecting the second bondpad to a second layer of conductive material on a first trench level of the first trench providing a connection to a bottom mirror; whereby the first contact portion circumscribes said second contact portion. This scheme yields an inverted ground without a change of the doping type of the first and the second distributed Bragg reflectors.

This is advantageous for 850 nm VCSELS, where n-type doping of the first distributed Bragg reflector dominates over p-type doping. Hence, an anode-ground configuration can be achieved with the additional advantages of bottom n-type doping. Further the second layer of conductive material allows an intracavity contact and the bottom mirror below this layer may have, but does not require additional doping to provide conductivity.

In a further embodiment, the first contact portion comprises a first bondpad and a narrow strip of conducting material connecting the first contact portion to a first layer of conductive material on top of the mesa across the first trench level of the first trench providing a connection to a top mirror. In this embodiment the first contact portion can be used as an common anode in an array arrangement.

In a particular embodiment, the first contact portion and the second contact portion are electrically separated by second trenches. The structure avoids a significant capacitance between the wiring pads and reduces significantly the overall parasitic capacitance.

In yet another embodiment, the first trench has at least partly a first depth defining a first trench level and the second trench has a second depth deeper than said first depth, defining a second trench level. Thus sufficient electrical separation between first and second contact portions can be provided, whereby a pad metallization and corresponding critical photolithographic steps over large height differences (more than 10 µm) from the VCSEL mesa top to the substrate can be avoided. This insures good lithographic fidelity and makes the process reproducible. Further, if the depth extends through the second distributed Bragg reflector and the light emitting active region, this feature enables intra-cavity contacting of the bottom mirror. This allows to grow the bottom mirror nominally undoped (apart from the relatively thin region between the contact layer and the cavity). The laser performance is then considerably enhanced due to a low free-carrier absorption in the mirrors. Moreover, a bond pad capacitance can be reduced.

In a further embodiment, the first and second contact portions are insulated from underlying conductive material by an insulating layer apart from regions where the first contact portion overlaps the second layer of conductive material for contacting the first distributed Bragg reflector; and the second contact portion overlaps the first layer of conductive material for contacting the second distributed Bragg reflector. This insulating layer can be very thin down to around 100 nm, so that it enables a high metal adhesion for reliable wire bonding and packaging.

In one embodiment, the first layer of conductive material substantially has a ring shape. The ring shape insures that the laser beam can pass through the contact layer of the top mirror without absorption within the layer. Moreover, the ring shape enables symmetrical carrier injection into the active region.

In yet another embodiment, the second layer of conductive material has a shape of a ring segment. Thus an adjustment to the symmetry of the mesa is achieved and the injection of charge carriers from the bottom mirror into the light emitting active region is more efficient.

In another embodiment, the ring segment spans an angle in the range of 90° to 270°. Thus a recess for a connection of the first layer of conductive material is provided.

In another embodiment, the second layer of conductive material extends up on a flank of the mesa, up to or less than a maximum of a level of the light emitting active region. This allows lateral injection of charge carriers into the active region.

In yet another embodiment a part of the second layer of conductive material which flanks the mesa surrounds the mesa. A better performance of the laser can be achieved because of a symmetrical injection of charge carriers.

In a further embodiment, the first trench has partly the depth of the second trench level apart from first and second contact portions. This further reduces parasitic capacitance.

In another embodiment at least one of said first and second distributed Bragg reflectors additionally comprise an insulating layer having a conductive opening. This results in an efficient carrier injection into the active region.

In yet another embodiment the insulating layer having a conductive opening is arranged at the interface between the light emitting active region and one of the first and second distributed Bragg reflectors. By that means, the carrier injection efficiency is further enhanced due to low current spreading.

In one embodiment, a semiconducting material of at least one of the first and second distributed Bragg reflector is partly undoped. This improves the reflectivity of the bottom mirror and/or the top mirror and considerably enhances the performance due to a low free carrier absorption in the mirrors, which is especially pronounced at telecom wavelength.

In a further embodiment, the first contact portion is used as a cathode-ground.

This configuration is suited for electrical drivers driving the VCSEL anode contact.

In yet another embodiment, the first contact portion is used as an anode-ground. This configuration is suited for electrical drivers driving the VCSEL cathode contact. Depending on the electrical driver technology, this contact configuration can reduce the electrical parasitics of the VCSEL/driver subsystem and can therefore enhance its speed performance.

In one embodiment, the semi-insulating substrate is transparent for laser radiation. This has advantages for bottom emitting lasers.

In another embodiment, the vertical cavity surface emitting laser device can be designed so that it forms a bottom emitting laser. Depending on the application, either the top emitting laser or the bottom emitting laser is more advantageous.

In a further embodiment, the vertical cavity surface emitting laser devices are arranged such that they comprise a plurality of vertical cavity surface emitting laser devices arranged in an array. Such an array expands the application range of vertical cavity surface emitting laser devices. For example, parallel or multi-wavelength applications are possible.

In a further embodiment, the first contact portions of the vertical cavity surface emitting laser devices in the array are electrically interconnected to form a common ground. This decreases the number of connections remarkably. The combination of the low capacitance design of the VCSEL with the common ground in the array provides low signal cross talk.

In one embodiment, the array is a one-dimensional array. Thus an array can be achieved with readily contactable VCSEL elements.

In a further embodiment, the first contact portion contacted to the second layer of conductive material and thereby providing contact to the bottom mirror is used as a common cathode of the plurality of the vertical cavity surface emitting laser devices in the array. As with the single devices, this configuration is used if the anode contacts are driven.

In yet another embodiment, the first contact portion contacted to the first layer of conductive material on top of the mesa is used as a common anode of the plurality of the vertical cavity surface emitting laser devices in the array. This configuration is used if the cathode contacts are driven. This enables the usage of certain driver technologies, which can result in lower electrical parasitics and better high-frequency performance.

In another aspect of the present invention a vertical cavity surface emitting laser device is provided by a method comprising: providing a semi-insulating substrate, a first stack of semiconductor layers representing a bottom distributed Bragg reflector, a light emitting active region, a second stack of semiconductor layers representing a top distributed Bragg reflector, stacked on top of each other; characterized by performing the following process steps: depositing a first layer of conductive material above a top epitaxial layer of the second stack of semiconductor layers for providing a contact area on the top distributed Bragg reflector; etching a first trench to structure a mesa and second trenches to structure a first contact portion and a second contact portion down to a first trench level; depositing second layer of conductive material on a section of the first trench level of the first trench for contacting the bottom distributed Bragg reflector; depositing an insulating film and subsequently reopen it, such that at least portions of the first layer of conductive material and the second layer of conductive material are exposed; depositing a third layer of conductive material at least partially over the insulating film for the first contact portion; and depositing a fourth layer of conductive material at least partially over the insulating film for the second contact portion; the first contact portion and the second contact portion are arranged at least partially coplanarly on a top layer of the vertical cavity surface emitting laser device.

This process sequence leads to a compatible and reliable fabrication sequence, which is the prerequisite for cost-effective fabrication. Thereby, no especially thick photoresists are required to bridge the large height differences, because all critical photolithographic steps are finished before the substrate deep etch.

In one embodiment, the first and second trenches are arranged such that the first contact portion circumscribes the second contact portion. This structure is advantageous for an array arrangement since it enables a common ground configuration.

In a further embodiment, additionally, the third layer of conductive material is deposited at least partially over the exposed portion of the second layer of conductive material; and, additionally, the fourth layer of conductive material is deposited at least partially over the exposed portion of the first layer of conductive material, so that the first contact portion is electrically connected to the bottom distributed Bragg reflector and the second contact portion is electrically connected to the top distributed Bragg reflector. This structure is advantageous for a common cathode configuration.

In another embodiment, additionally, the third layer of conductive material is deposited at least partially over the exposed portion of the first layer of conductive material; and, additionally, the fourth layer of conductive material is deposited at least partially over the exposed portion of the second layer of conductive material, so that the first contact portion is electrically connected to the top distributed Bragg reflector and the second contact portion is electrically connected to the bottom distributed Bragg reflector. This structure is also advantageous for an array arrangement. In addition, this structure allows an anode-ground configuration without a change of the doping type of the first and the second distributed Bragg reflectors. This is advantageous for 850 nm VCSELs, where n-type doping of the first distributed Bragg reflector dominates over p-type doping.

In one embodiment, the first trench and the second trenches are commonly etched to a first trench level. Thus, a mesa, a first contact portion and a second contact portion can be structured.

In a further embodiment, the method for making a vertical cavity surface emitting laser device further comprises the step of deepening the second trenches by etching to a second trench level. By this a better electrical isolation between first and second contact region can be achieved and the bond pad capacitance is reduced.

In yet another embodiment, the third and fourth layer of conductive material are deposited in one step. This makes the fabrication more economic.

In another embodiment, the deposition of any of the first, second, third and fourth layer of conductive material comprises at least one of a lift off process and a conventional planar technique in combination with at least one of a chemical vapor deposition method and an epitaxial growth of a semiconductor. In this way, layers of high conductivity can be achieved.

In yet another embodiment, the deposition of conductive material comprises an implanting step with doping material. By this, a high conductivity can be achieved while keeping a substantially flat surface without steps.

In the following, the present invention will be explained exemplarily by means of preferred embodiments, with regard to accompanying figures, and further advantages and embodiments will become apparent, whereby:

BRIEF DESCRIPTION OF THE DRAWINGS

FIG. 2a shows the vertical cross section indicated by the dashed line a—a in FIG. 1a;

FIG. 3 illustrates subsequent processing steps in a processing sequence for a low capacitance vertical cavity surface emitting laser according to the embodiments of the present invention in FIGS. 1a and 1b.

DETAILED DESCRIPTION OF THE PREFERRED EMBODIMENTS

Figure 1A:
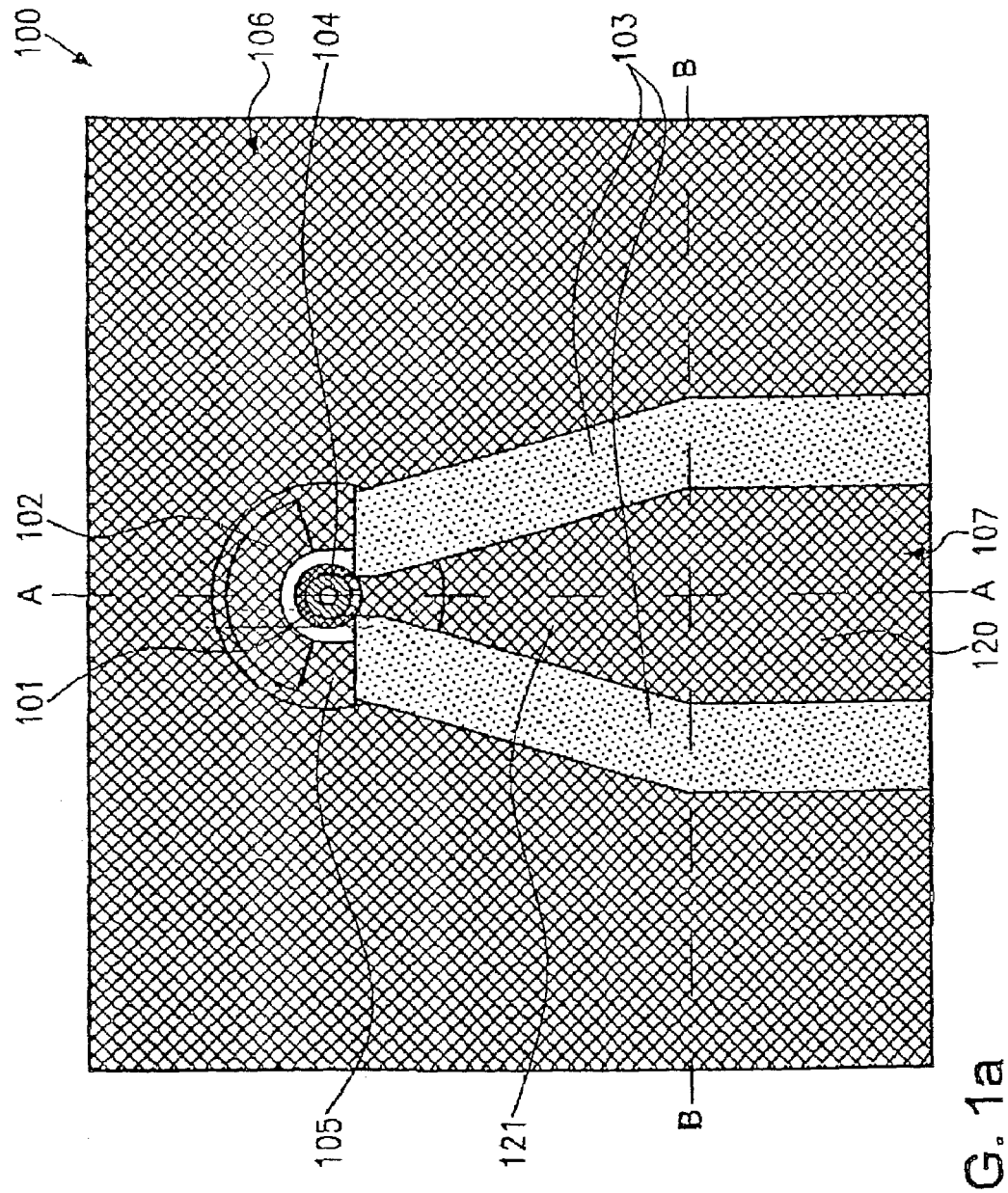
FIG. 1a shows a top view of an embodiment of a vertical cavity surface emitting laser chip according to the present invention.
Figure 1B:
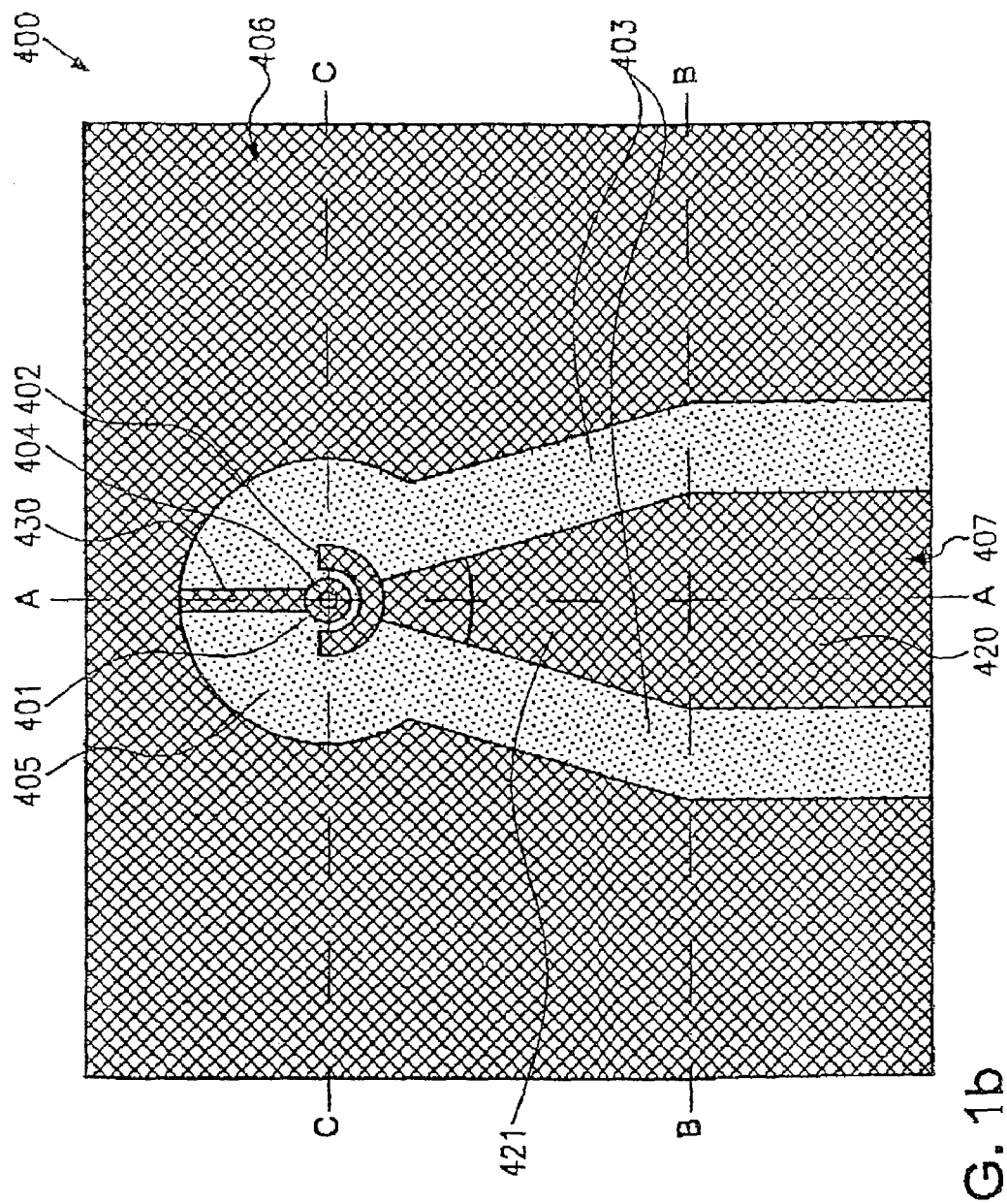
FIG. 1b shows a top view of an embodiment of a vertical cavity surface emitting laser chip according to another embodiment of the present invention.

FIGS. 1a and 1b show main elements of a lateral structure of an embodiment of a vertical cavity surface emitting laser (VCSEL) chip according to two embodiments of the present invention. In both cases the chip 100, 400 comprises a mesa 101, 401 region, a ring-shaped electrode 104, 404 including a first layer of conductive material on top of the mesa 101, 401 region, a second layer of conductive material 102,402 for contacting a first distributed Bragg reflector or a bottom mirror, a first trench 105, 405 surrounding the mesa 101, 401 region, a first contact portion 106, 406 and a second contact portion 107, 407, and second trenches 103, 403.

FIGS. 1a and 1b are top views onto a surface of the chip which comprises a semi-insulating substrate subsequently followed by a stack of semiconductor layers representing the first distributed Bragg reflector, a light emitting active area, and a second stack of semiconducting layers representing a second distributed Bragg reflector.

Into this surface a first trench 105, 405 is etched through the second distributed Bragg reflector and the light emitting active region to form the mesa 101, 401 with a circular shape.

With the first embodiment of the present invention, illustrated in FIG. 1a, there are three distinguishing regions within the first trench 105. The first region is covered by a conductive material which connects the ring-shaped electrode 104 on top of the mesa 101 with the rectangular bond pad 120 and is part of the second contact portion 107. The second region of the first trench 105 is part of the second trenches 103. The third region is part of the first contact portion 106 which connects electrically the first distributed Bragg reflector. The third region of the first trench 105 is at least partly covered by the second layer of conductive material 102.

With the first embodiment in FIG. 1a the third layer of conductive material covers the third part of the first trench 105. The third layer of conductive material is spread over the rest of the chip surface apart from the mesa 101, the second trenches 103 and the second contact portion 107 and connects electrically a first bond pad anywhere on the first contact portion 106 with the first distributed Bragg reflector. In the following, the third layer of conductive material, the second layer of conductive material 102 and the first bond pad is referred to as the first contact portion 106.

On top of the mesa 101, the ring-shaped electrode 104 is deposited. With the latter embodiment (FIG. 1a) the ring-shaped electrode 104 is electrically connected to a second bond pad 120. In the following, the second bond pad 120 and a connection to the ring-shaped electrode 104 is referred to as a "second contact portion 107." The second contact portion 107 comprises the second bond pad 120 and an electrically conductive strip 121 tapered from the second bond pad 120 towards the ring-shaped electrode 104 across the first trench 105.

In the case of the second embodiment of the present invention, exemplified in FIG. 1b, the first trench 405 can also be separated into three distinguishing regions. However, the regions are located at different positions. Here, the first region covered by a conductive material is on the opposite side of the mesa and connects the ring-shaped electrode 404 on top of the mesa 401 with the bond pads of the first contact portion 406. The second region of the first trench 405 almost surrounds the mesa and is part of the second trenches 403. Here, the third region is part of the second contact portion 407 and connects the first distributed Bragg reflector. The third region of the first trench 405 is at least partly covered by the second layer of conductive material 402.

In the context of the latter embodiment (FIG. 1b) the first contact portion 406 is similarly defined as before and comprises the first bondpads and the conductive strip connecting these bondpads to the ring-shaped electrode 404 across the first region of the first trench 405.

Moreover, in the context of FIG. 1b, the second bond pad 420, the conductive strip 421 tapered to the second layer of conductive material 402, as well as the second layer of conductive material 402 are denoted as the "second contact portion 407."

For the embodiments in FIGS. 1a and 1b the second contact portion 107, 407 is separated from adjacent regions by the second trenches 103, 403 which may extend through the second distributed Bragg reflector, the light emitting active region and the first distributed Bragg reflector down to the semi-insulating substrate.

Figure 2A:
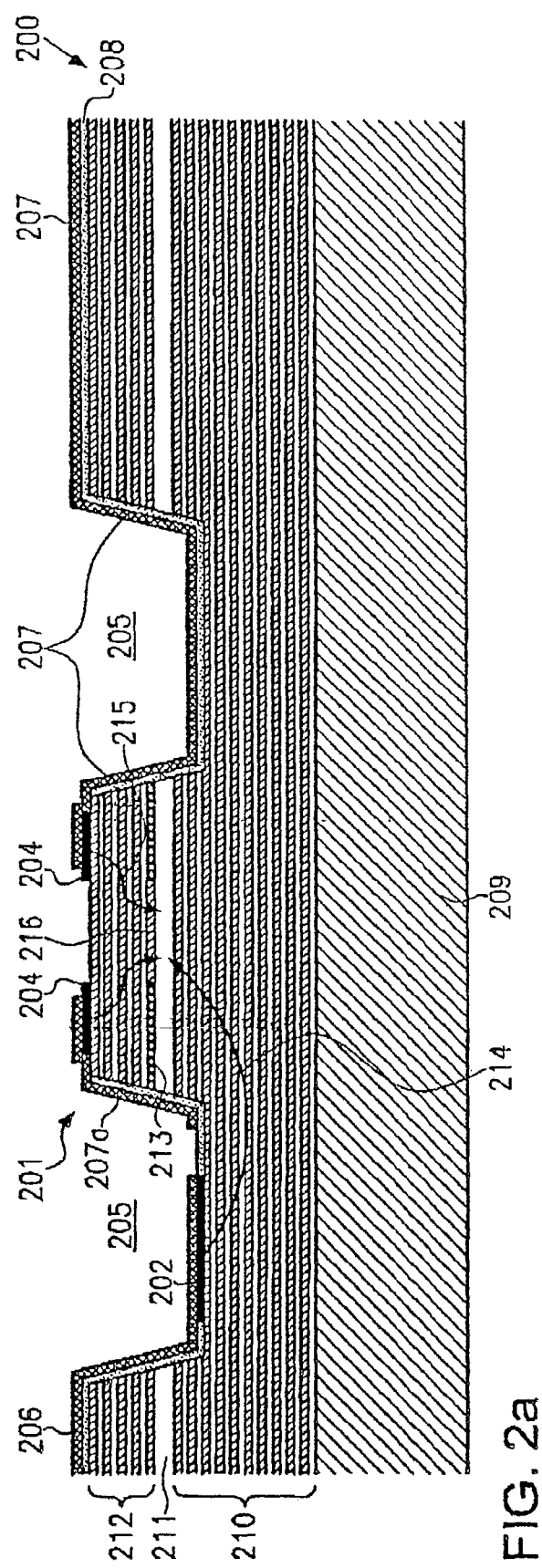

FIG. 2a illustrates a cross-sectional view of the embodiment of this invention of FIG. 1a along the line a—a. The mesa 201 region is formed within a stack of semiconductor components comprising four main components. A first component includes the semi-insulating substrate 209 as basis material. A second component comprises a first stack of semiconductor layers 210 which forms the first distributed Bragg reflector 210 representing a bottom mirror 210. The first stack of semiconductor layers 210, the first distributed Bragg reflector 210 and the bottom mirror 210 represent the same component and the same reference number is therefore used. The bottom mirror 210 is placed on a plane surface of the semi-insulating substrate 209. Third and fourth components are stacked sequentially on top of the bottom mirror 210, whereby the third component comprises the light emitting active region 211 and the fourth component includes the second stack of semiconductor layers 212 to which it is also referred herein as a top mirror 212.

The first trench 205 is etched through the top mirror 212 and the light emitting active region 211 to uncover at least partially the bottom mirror 210 and to form the mesa 201 with the circular shape. The exposed part of the bottom mirror 210 is covered by the second layer of conductive material 202. With the first embodiment (FIG. 1a) the second layer of conductive material connects the bottom mirror 210 with the first bond pad via the third layer of conductive material 206 (FIG. 2a).

On the top surface of the mesa 201 a ring-shaped layer of conductive material 204 representing the ring shaped electrode 204 is deposited.

The surface of the foregoing structure is covered with an insulating layer 208 except for the second layer of conductive material 202 and the top surface of the mesa 201 including the ring-shaped electrode 204.

With the first embodiment the ring-shaped electrode 204 is connected to the rectangular bond pad of the second contact portion via a fourth layer of conductive material 207 which overlaps at least partially the ring-shaped electrode 204 and extends across the first trench 205 (FIG. 2a).

The fourth layer of conductive material 207 may surround the mesa 201 and may cover the opposite side 207a of the mesa 201. Between the light emitting active region 211 and the top mirror 212, there may be an insulating ring layer 213 with a conductive opening 216.

The top mirror 212 may be doped with n-type material or p-type material. The bottom mirror 210 may be doped with a material of the opposite conductivity type compared to the top mirror 212. In this way, a p-n junction can be formed within the light emitting active region 211.

A preferred embodiment of this invention uses p-type material for the top mirror 212 and n-type material for the bottom mirror 210, such that the top mirror 212 is used as an anode.

Applying a voltage having appropriate polarity between the top mirror 212 and the bottom mirror 210 causes the first current of charge carriers 214 from the contact region 202 and a second current of charge carriers 215 from the ring-shaped electrode 204 to flow towards the light emitting active region 211. In case of the preferred embodiment, wherein the bottom mirror 210 is doped with n-type material and the top mirror is doped with p-type material, the first current of charge carriers 214 is represented by a current of electrons 214 and the second current of charge carriers 215 is represented by a current of holes 215. The current of holes 215 and the current of electrons 214 recombine within the light emitting active region 211 under emission of light due to a direct band gap of the semiconductor material.

The light emitting active region 211 may comprise a quantum well structure which includes at least one extremely thin layer of doped or undoped III-V semiconductor material, which improves the efficiency of light emission.

The insulating ring layer 213 having the conductive opening 216 between the light emitting active region 211 and the top mirror 212 focuses the recombination process to the conductive opening 216 and allows better lateral confinement of the optical mode. The insulating ring layer 213 may be placed anywhere in the vicinity of the light emitting active region. The insulating ring layer 213 can be provided by selective oxidization of one of the semiconductor layers having e.g. a high aluminum content by lateral diffusion of oxygen from a mesa flank.

Since the second layer of conductive material 202 can be laid close to the light emitting active region, according to the invention, the path for the first current of charge carriers 214 towards the light emitting active region 211 is short and the resistive losses may be kept small even if the bottom mirror is only moderately doped.

Since the path for the first current of charge carriers 214 from the second layer of conductive material towards the light emitting active region 211 is very short, to this contact configuration is referred to as an intracavity contact.

In case of an undoped bottom mirror the injection of charge carriers into the light emitting active region 211 may be improved by providing a single layer with enhanced conductivity.

Undoped mirrors are advantageously used to avoid capacitance effects within the mirror and to reduce light absorption within the mirror.

It has to be mentioned, that vice versa doped semiconductors have to be regarded as part of this invention.

The bottom mirror 210 and the top mirror 212 are made of alternating layers of high and low indices of refraction. Each pair of alternating layers are grown to a thickness of ½ of the emission wavelength propagating in the layer. Typically $Al_xGa_{1-x}As$ layers with two different Al-contents are used for the mirror pairs. Other material combinations are, however, also possible providing a pair of layers with a high and a low refractive index, preferably a III-V semiconductor is used as a base material. In case of undoped mirrors, any kind of dielectric or semiconductor material having an appropriate index of refraction may be used.

In a top emitting vertical cavity surface emitting laser a bottom mirror may comprise up to 40 alternating layers resulting in a reflectivity of 99.9%. The top mirror may comprise 25 layers, resulting in a reflectivity of 99%.

The insulation layer 208 may be formed of $Si_3N_4$, SiC or $SiO_2$, and the like. The insulating ring layer 213 may be formed of $(Al_xGa_{1-x})_2O_3$, $Si_3N_4$, SiC, $SiO_2$, or undoped semiconductors and the like.

The insulation layer 208 may be very thin (100 nm to 300 nm) since the device capacitance is independent of the insulation layer thickness. This enables high adhesion and a reliable manufacturing process.

The conductive materials of first, second, third and fourth layer of conductive materials may be at least one of a metal and a highly doped semiconductor. In that way, the material for the different contact areas can be chosen to be compatible to underlying material and process steps.

Figure 2B:
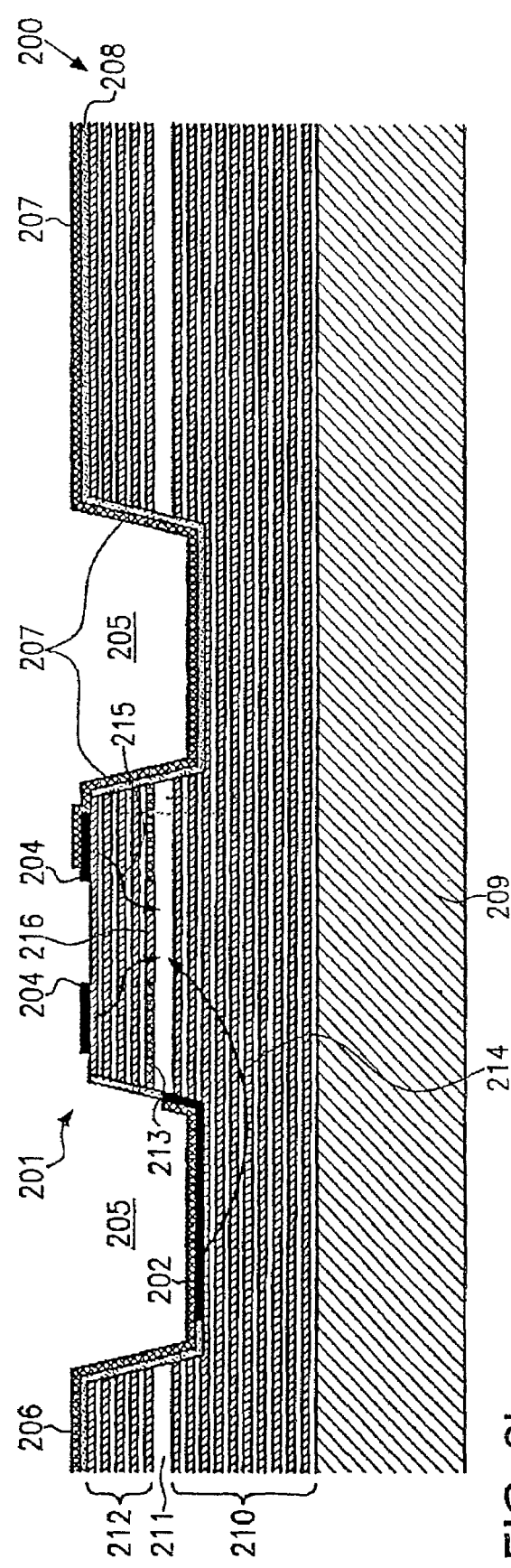
FIG. 2b shows the vertical cross section indicated by the dashed line a—a in FIG. 1a according to another embodiment of the present invention.

FIG. 2b shows a cross-sectional view according to another embodiment of this invention having the same cut as in FIG. 2a. The contact region 202 is formed such it extends from the bottom of the moat 205 upwards a flank of the mesa 201 up to a maximum of a level of the light emitting region 211. This allows a lateral injection of charge carriers into the light emitting region 211. Further this leads to lower parasitic capacitance and losses.

Figure 2C:
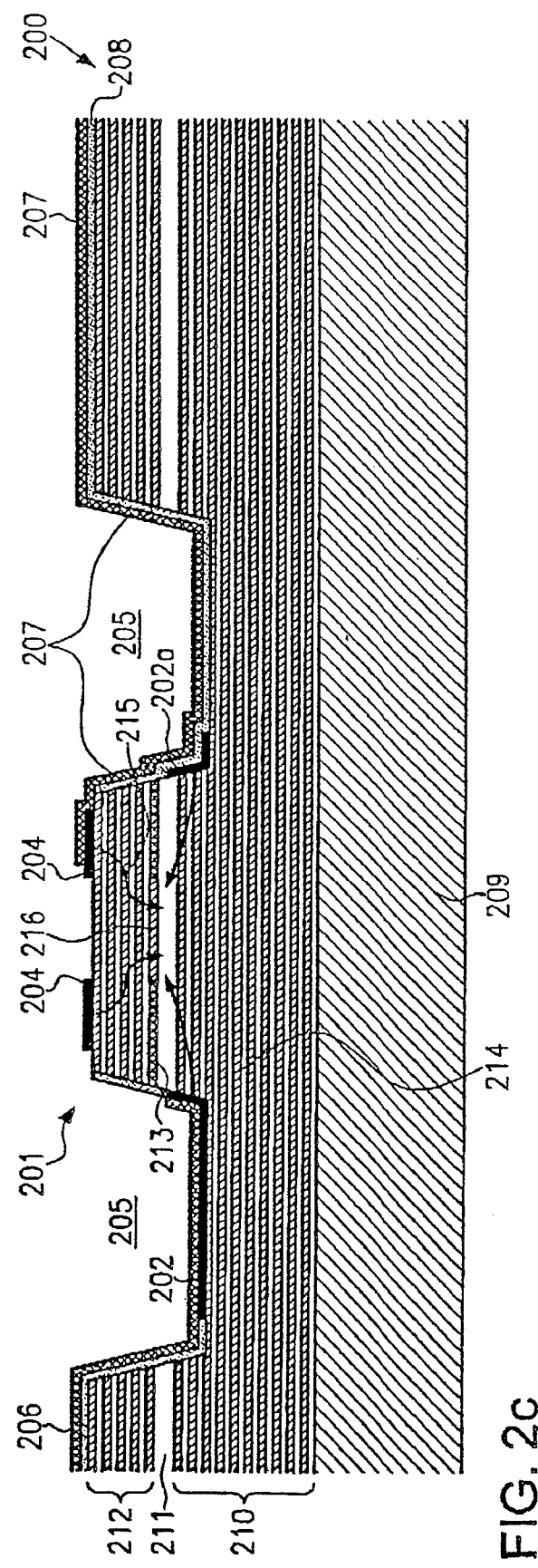
FIG. 2c shows the vertical cross section indicated by the dashed line a—a in FIG. 1a according to a further embodiment of the present invention.

FIG. 2c shows a further embodiment of this invention in a cross-sectional view along the line a—a of FIG. 1a. In contrast to the embodiment shown in FIG. 2b, a part 202a of the conductive pad 202 which flanks the mesa 201 surrounds the mesa 201. Thus a symmetrical injection of charge carriers is provided.

Figure 2D:
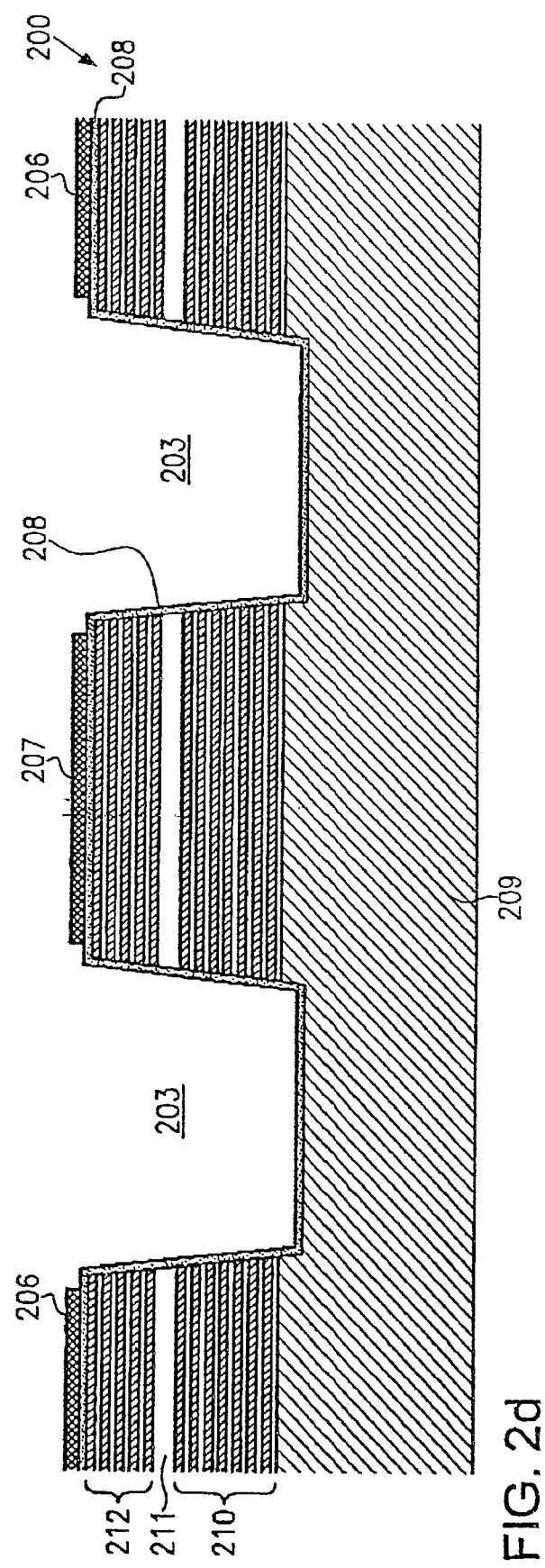
FIG. 2d shows the horizontal cross section indicated by the dashed line b—b in FIG. 1a and in FIG. 1b.

FIG. 2d is a cross-sectional view of a vertical cavity surface emitting laser according to the present invention along the line b—b of FIG. 1a. The corresponding cross-section along b—b in FIG. 1b is identical. The semiconductor layers between the center strip 207 and the outer ground strips 206 are removed up to the semi-insulating substrate 209 forming a coplanar deep trench 203. The first contact portion comprising the third layer of conductive material 206 and the second contact portion comprising the fourth layer of conductive material 207 are arranged at least partially coplanarly above a top epitaxial layer of the vertical cavity surface emitting laser device, such that at least the first bond pad and the second bond pad are arranged coplanarly on a top surface of a chip. The term "coplanar" is used in the sense that flip chip bonding is possible. The deep trenches are of the key element in reducing the bondpad capacitance.

Since the chip design does not depend on a specific epitaxial material system or on the details of the epitaxial layer structure, the chip design is not restricted to vertical cavity surface emitting lasers of a certain emission wavelength regime. Instead, the chip design can be applied for short wavelength data communication vertical cavity surface emitting lasers (780 nm to 980 nm), but also for vertical cavity surface emitting lasers in the longer wavelength telecommunication regime (1,200 nm to 1,400 nm and 1450 nm to 1650 nm). Some features of the design, however, have different importance in the two wavelength regimes. It has to be noted in this respect that intracavity contacts are especially advantageous at telecom wavelength, since these allow to grow the bottom mirror nominally undoped (apart from the relatively thin region between the contact layer and the cavity). The laser performance is considerably enhanced due to a low free carrier absorption in the mirrors, which is especially pronounced at telecom wavelength. Moreover, the chip design is not restricted to a top emitting laser, but can also be applied to a bottom emitting lasers. If the substrate is transparent for the laser emission, this would not require additional processing steps, but only a modification of the wiring metallization to cover the whole surface of the vertical cavity surface emitting laser mesa to enhance the reflectivity of the top mirror. Additionally, the chip design is suited for one-dimensional arrays. In this case, the ground metallization for the individual devices would be connected to form a common ground. As previously mentioned, a low capacitance is important in this case, since it allows low high-frequency cross talk between next devices.

Figure 2E:
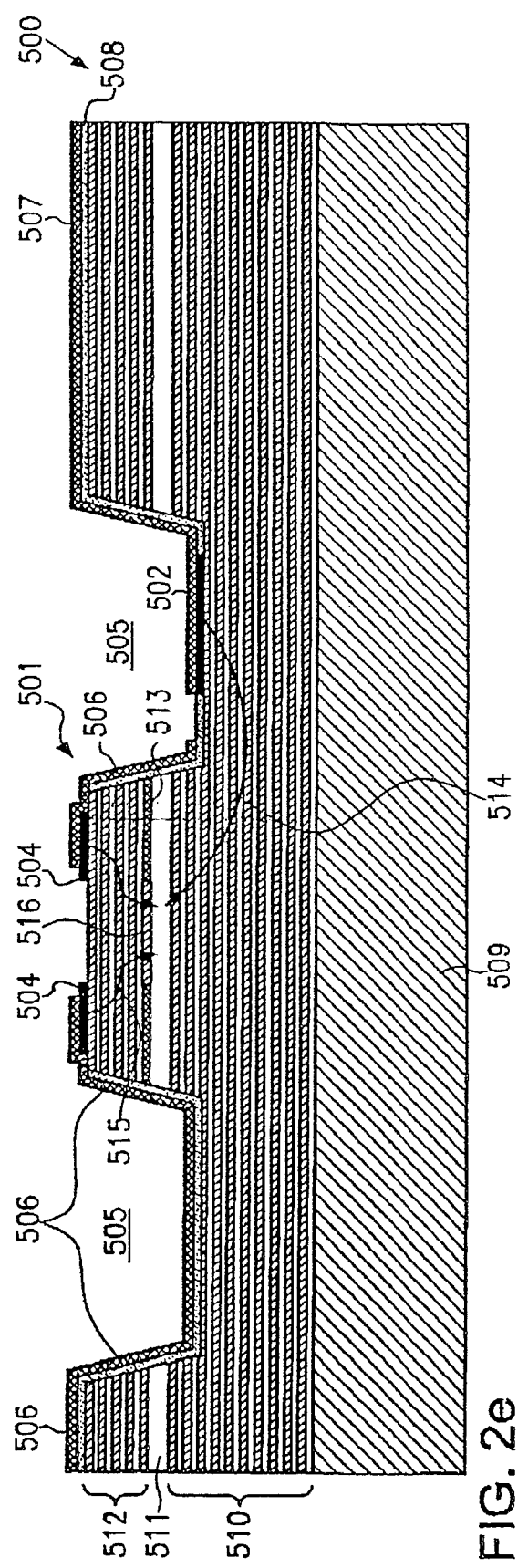
FIG. 2e shows the vertical cross section indicated by the dashed line a—a in FIG. 1b.

FIG. 2e is a cross-sectional view of a vertical cavity surface emitting laser according to the present invention along the line a—aaccording to the second embodiment as exemplified in FIG. 1b. In this case, the second layer of conductive material connects the bottom mirror 510 with the bond pad of the second contact portion 507. The ring-shaped electrode 504 is connected to the rectangular bond pads of the first contact portion 506 via a third layer of conductive material which overlaps at least partially the ring-shaped electrode 504 and extends across the first trench 505 on a first trench level.

Figure 2F:
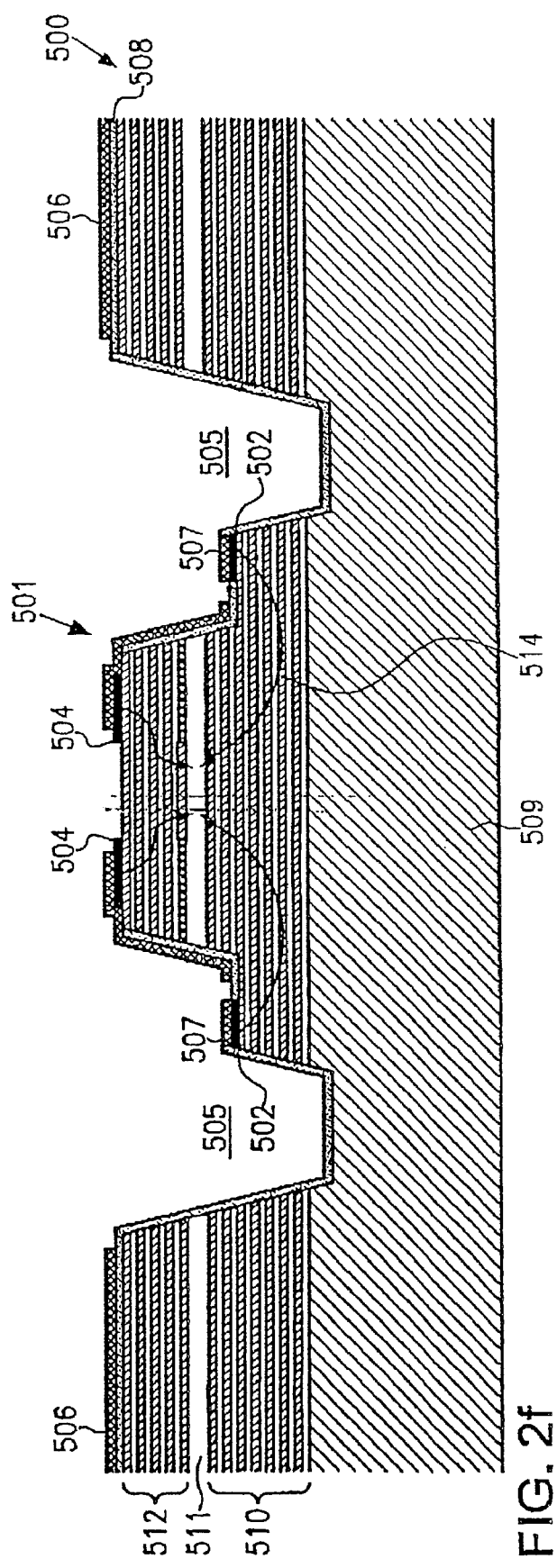
FIG. 2f shows the horizontal cross section indicated by the dashed line c—c in FIG. 1b.

FIG. 2f is a cross-sectional view of a vertical cavity surface emitting laser according to the present invention along the line c-c according to the second embodiment as exemplified in FIG. 1b. In this cross-sectional view, the second layer of conductive material 502 is positioned on a first trench level of a part of the first trench 505 which flanks the mesa 501. The second layer of conductive material 502 is covered by a conductive layer, which is part of the second contact portion 507. The remaining part of the first trench 505 is deepened to a second trench level deeper than that first level. In this way, an improved separation of the contact portions with reduced parasitic capacitance, an efficient injection of charge carriers into the light emitting active region, and a reliable fabrication process can be provided, wherein metallization across the deep trenches is avoided.

FIG. 3 schematically illustrates the main processing steps for the chip design in FIG. 1a.

FIG. 3a shows a state after a standard lift-off process for the definition of the contact rings 304 and the definition of a doughnut-shaped moat 305 down to the contact layer sequence of the bottom mirror. This first etching step is also used to etch the trenches 303 between the coplanar stripes 306, 307 down to the contact layers of the bottom mirror. This reduces the etching time required for the deep coplanar trenches 303 in the final step by a factor of 2. Any dry etch or wet chemical etch process known in the art may be used to form the moat and the trenches.

In FIG. 3b, a layer of conductive material for the contact region 302 is deposited or evaporated on parts of the exposed bottom mirror.

For electrical isolation, a $Si_3N_4$ film is deposited over the whole wafer and subsequently reopened on top of the vertical cavity surface emitting laser mesa 301 and the contact region 302. Then, a wiring metallization is deposited to form the bond pads in the ground-signal-ground configuration and connect them with the respective contacts by short coplanar line (FIG. 3c).

FIG. 3d illustrates the deepening of the coplanar trenches to the semi-insulating substrate by an additional etching step.

Since all critical photolithographic steps are finished before the substrate deep etch, no especially thick photoresists are required to bridge the large height differences.

Etching of the first trench and the second trenches are at least one of a dry and a wet chemical etch process.

Process steps for the chip design according to the first embodiment, exemplified in FIG. 1a, and the second embodiment, exemplified in FIG. 1b, are performed analogously (not shown) by arranging the second trenches, such that, by definition, the first contact portion circumscribes the second contact portion, whereby the first contact portion is either connected with the bottom mirror (FIG. 1a) or with the top mirror (FIG. 1b).

While the present invention has been described with respect to the preferred embodiments, it should be appreciated by those skilled in the art that various modifications may be made without departing from the spirit and scope of this invention.

What is claimed is:

1. A vertical cavity surface emitting laser device comprising:
   a first stack of semiconductor layers representing a first distributed Bragg reflector;
   a second stack of semiconductor layers representing a second distributed Bragg reflector;
   a light emitting active region arranged between said first and second distributed Bragg reflectors;
   a mesa region surrounded at least partly by a first trench;
   a semi-insulating substrate; and
   a first contact portion and a second contact portion each contacting one of said first distributed Bragg reflector and said second distributed Bragg reflector,
   the first contact portion and the second contact portion are arranged at least partially coplanarly above a top epitaxial layer of the vertical cavity surface emitting laser device.

2. The vertical cavity surface emitting laser device according to the claims 1, wherein said second contact portion comprises a second bondpad and a conductive line connecting said second bondpad to a first layer of conductive material on top of said mesa across a first trench level of said first trench providing a connection to a top mirror.

3. The vertical cavity surface emitting laser device according to claim 2, wherein said first contact portion comprises a first bondpad connected to a second layer of conductive material on said first trench level of said first trench providing a connection to a bottom mirror.

4. The vertical cavity surface emitting laser device according to claim 3, wherein the first layer of conductive material substantially has a ring shape.

5. The vertical cavity surface emitting laser device according to claim 4, wherein said second layer of conductive material has a shape of a ring segment.

6. The vertical cavity surface emitting laser device according to claim 5, characterized in that said ring segment spans an angle in the range of 90° to 270°.

7. The vertical cavity surface emitting laser device according to claim 3, wherein said second layer of conductive material extends up on a flank of the mesa, up to or less than a maximum of a level of the light emitting active region.

8. The vertical cavity surface emitting laser device according to claim 7, wherein a part of said second layer of conductive material which flanks the mesa surrounds the mesa.

9. The vertical cavity surface emitting laser device according to claim 8, wherein said first trench has partly the depth of said second trench level apart from first and second contact portions.

10. The vertical cavity surface emitting laser device according to claim 1, wherein said first contact portion circumscribes said second contact portion.

11. The vertical cavity surface emitting laser device according to the claim 1, wherein said second contact portion comprises a second bondpad and a conductive line connecting said second bondpad to a second layer of conductive material on a first trench level of said first trench providing a connection to a bottom mirror; whereby said first contact portion circumscribes said second contact portion.

12. The vertical cavity surface emitting laser device according to claim 11, wherein said first contact portion comprises a first bondpad and a narrow strip of conducting material connecting said first contact portion to a first layer of conductive material on top of said mesa across said first trench level of said first trench providing a connection to a top mirror.

13. The vertical cavity surface emitting laser device according to claim 1, wherein said first contact portion and said second contact portion are electrically separated by second trenches.

14. The vertical cavity surface emitting laser device according to claim 1, wherein said first trench has at least partly a first depth defining said first trench level, and said second trenches have a second depth, deeper than said first depth, defining a second trench level.

15. The vertical cavity surface emitting laser device according to claim 1, wherein at least one of said first and said second contact portions are at least partly insulated from underlying conductive material by an insulating layer.

16. The vertical cavity surface emitting laser device according to claim 1, wherein at least one of said first and second distributed Bragg reflectors additionally comprises an insulating layer having a conductive opening.

17. The vertical cavity surface emitting laser device according to claim 16, wherein said insulating layer having a conductive opening is arranged at the interface between the light emitting active region and one of said first and second distributed Bragg reflectors.

18. The vertical cavity surface emitting laser device according to claim 1, wherein a semiconducting material of at least one of said first and second distributed Bragg reflector is partly undoped.

19. The vertical cavity surface emitting laser device according to claim 1, wherein said first contact portion is used as a cathode-ground.

20. The vertical cavity surface emitting laser device according to claim 1, wherein said first contact portion is used as an anode-ground.

21. The vertical cavity surface emitting laser device according to claim 1, wherein said semi-insulating substrate is transparent for laser radiation.

22. The vertical cavity surface emitting laser device according to claim 21, wherein said vertical cavity surface emitting laser device is a bottom emitting laser.

23. An arrangement of vertical cavity surface emitting laser devices according to claim 1, comprising a plurality of said vertical cavity surface emitting laser devices arranged in an array.

24. The arrangement according to claim 23, wherein one of said first and second contact portions of said vertical cavity surface emitting laser devices in said array are electrically interconnected to form a common ground.

25. The arrangement according to claim 24, wherein said second contact portion contacted to a first layer of conductive material on top of the mesa is used as a common anode of the plurality of the vertical cavity surface emitting laser devices in the array.

26. The arrangement according to claim 24, wherein said first contact portion contacted to a second layer of conductive material on the first trench level of the first trench is used as a common cathode of the plurality of the vertical cavity surface emitting laser devices in the array.

27. The arrangement according to claim 23, wherein said array is a one-dimensional array.

28. A vertical cavity surface emitting laser device comprising:

a first stack of semiconductor layers representing a first distributed Bragg reflector;

a second stack of semiconductor layers representing a second distributed Bragg reflector;

a light emitting active region arranged between said first and second distributed Bragg reflectors;

a mesa region surrounded at least partly by a first trench;

a semi-insulating substrate; and a first contact portion and a second contact portion each contacting one of said first distributed Bragg reflector and said second distributed Bragg reflector, the first contact portion and the second contact portion are arranged at least partially coplanarly above a top epitaxial layer of the vertical cavity surface emitting laser device, and wherein the second contact portion is surrounded by and electrically separated from the first contact portion by second trenches.

* * * * *